United States Patent
Jacob et al.

(10) Patent No.: US 9,117,875 B2
(45) Date of Patent: Aug. 25, 2015

(54) METHODS OF FORMING ISOLATED GERMANIUM-CONTAINING FINS FOR A FINFET SEMICONDUCTOR DEVICE

(71) Applicants: GLOBALFOUNDRIES Inc., Grand Cayman (KY); International Business Machines Corporation, Armonk, NY (US)

(72) Inventors: Ajey Poovannummoottil Jacob, Albany, NY (US); Murat Kerem Akarvardar, Saratoga Springs, NY (US); Jody A. Fronheiser, Delmar, NY (US); Kangguo Cheng, Schenecdtady, NY (US); Bruce Doris, Slingerlands, NY (US); Kern Rim, Yorktown Heights, NY (US)

(73) Assignees: GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 66 days.

(21) Appl. No.: 14/155,499

(22) Filed: Jan. 15, 2014

(65) Prior Publication Data

US 2015/0200128 A1 Jul. 16, 2015

(51) Int. Cl.
| H01L 21/76 | (2006.01) |
|---|---|
| H01L 21/762 | (2006.01) |
| H01L 21/02 | (2006.01) |
| H01L 21/8234 | (2006.01) |
| H01L 29/66 | (2006.01) |
| H01L 21/306 | (2006.01) |
| H01L 21/324 | (2006.01) |

(52) U.S. Cl.
CPC .... *H01L 21/76224* (2013.01); *H01L 21/02532* (2013.01); *H01L 21/306* (2013.01); *H01L 21/324* (2013.01); *H01L 21/823431* (2013.01); *H01L 29/6653* (2013.01); *H01L 29/66553* (2013.01); *H01L 29/66795* (2013.01)

(58) Field of Classification Search
CPC ............ H01L 29/66795; H01L 29/785; H01L 29/1054; H01L 21/0245; H01L 21/0251; H01L 21/02532; H01L 29/66666; H01L 29/7827; H01L 27/0924; H01L 29/41791; H01L 21/76224
USPC .............................. 438/424; 257/401, E21.54
See application file for complete search history.

(56) References Cited

U.S. PATENT DOCUMENTS

| 7,902,584 | B2 * | 3/2011 | Nakajima ...................... 257/308 |
| 8,263,462 | B2 | 9/2012 | Hung et al. |
| 2014/0353767 | A1 * | 12/2014 | Liu et al. ....................... 257/401 |
| 2015/0102386 | A1 * | 4/2015 | Chen et al. ..................... 257/192 |

OTHER PUBLICATIONS

U.S. Appl. No. 13/736,111, filed Jan. 8, 2013.

* cited by examiner

*Primary Examiner* — Sonya D McCall Shepard
(74) *Attorney, Agent, or Firm* — Amerson Law Firm, PLLC

(57) ABSTRACT

Forming a plurality of initial trenches that extend through a layer of silicon-germanium and into a substrate to define an initial fin structure comprised of a portion of the layer of germanium-containing material and a first portion of the substrate, forming sidewall spacers adjacent the initial fin structure, performing an etching process to extend the initial depth of the initial trenches, thereby forming a plurality of final trenches having a final depth that is greater than the initial depth and defining a second portion of the substrate positioned under the first portion of the substrate, forming a layer of insulating material over-filling the final trenches and performing a thermal anneal process to convert at least a portion of the first or second portions of the substrate into a silicon dioxide isolation material that extends laterally under an entire width of the portion of the germanium-containing material.

20 Claims, 10 Drawing Sheets

US 9,117,875 B2

METHODS OF FORMING ISOLATED GERMANIUM-CONTAINING FINS FOR A FINFET SEMICONDUCTOR DEVICE

BACKGROUND OF THE INVENTION

1. Field of the Invention

Generally, the present disclosure relates to the manufacture of FET semiconductor devices, and, more specifically, to various methods of forming isolated germanium-containing fins for a FinFET semiconductor device.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A conventional FET is a planar device that typically includes a source region, a drain region, a channel region that is positioned between the source region and the drain region, and a gate electrode positioned above the channel region. Current flow through the FET is controlled by controlling the voltage applied to the gate electrode. For example, for an NMOS device, if there is no voltage applied to the gate electrode, then there is no current flow through the NMOS device (ignoring undesirable leakage currents, which are relatively small). However, when an appropriate positive voltage is applied to the gate electrode, the channel region of the NMOS device becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the past decades. More specifically, the channel length of FETs has been significantly decreased, which has resulted in improving the switching speed and in lowering operation currents and voltages of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. FIG. 1 is a perspective view of an illustrative prior art FinFET semiconductor device 10 that is formed above a semiconductor substrate 12 that will be referenced so as to explain, at a very high level, some basic features of a FinFET device 10. In this example, the FinFET device 10 includes three illustrative fins 14, a gate structure 16, sidewall spacers 18 and a gate cap layer 20. The gate structure 16 is typically comprised of a layer of gate insulating material (not separately shown), e.g., a layer of high-k insulating material or silicon dioxide, and one or more conductive material layers (e.g., metal and/or polysilicon) that serve as the gate electrode for the device 10. The fins 14 have a three-dimensional configuration: a height 14H, a width 14W and a long-axis or axial length 14L. The axial length 14L corresponds to the direction of current travel in the device 10 when it is operational. The dashed line 14C depicts the long-axis or centerline of the fins 14. The portions of the fins 14 covered by the gate structure 16 are the channel regions of the FinFET device 10. In a conventional process flow, the portions of the fins 14 that are positioned outside of the spacers 18, i.e., in the source/drain regions of the device 10, may be increased in size or even merged together (a situation not shown in FIG. 1) by performing one or more epitaxial growth processes. The process of increasing the size of or merging the fins 14 in the source/drain regions of the device 10 is performed to reduce the resistance of source/drain regions and/or make it easier to establish electrical contact to the source/drain regions. Even if an epi "merge" process is not performed, an epi growth process will typically be performed on the fins 14 to increase their physical size.

In the FinFET device 10, the gate structure 16 may enclose both sides and the upper surface of all or a portion of the fins 14 to form a tri-gate structure so as to use a channel having a three-dimensional structure instead of a planar structure. In some cases, an insulating cap layer (not shown), e.g., silicon nitride, is positioned on the top surface of the fins 14 and the FinFET device 10 only has a dual-gate structure (sidewalls only). Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to significantly reduce short channel effects. When an appropriate voltage is applied to the gate electrode of a FinFET device, the surfaces (and the inner portion near the surface) of the fins 14, i.e., the vertically oriented sidewalls and the top upper surface of the fin, form a surface inversion layer or a volume inversion layer that contributes to current conduction. In a FinFET device, the "channel-width" is estimated to be about two times ($2x$) the vertical fin-height 14H of the fin 14 plus the width of the top surface of the fin 14, i.e., the fin width 14W. Multiple fins can be formed in the same foot-print as that of a planar transistor device. Accordingly, for a given plot space (or foot-print), FinFET devices tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond. The gate structures 16 for such FinFET devices 10 may be manufactured using so-called "gate-first" or "replacement gate" (gate-last) manufacturing techniques.

However, FinFET devices still exhibit some performance-limiting characteristics. As noted above, one such characteristic that is detrimental to all forms of semiconductor devices, both FinFETs and planar FETs, is off-state leakage currents. Ideally, off-state leakage current is minimized to increase device performance. In the case of a FinFET device, it has been noted that the so-called "punch through leakage current" densities vary along the vertical length of the fins, with the current densities being much greater at the bottom of the fins proximate the local isolation regions of the device. See, e.g., Okano et al., "Process Integration Technology and Device Characteristics of CMOS FinFET on Bulk Silicon Substrate with sub-10 nm Fin Width and 20 nm Gate Length," *IEDM Technical Digest*, pp. 721-724, 2005. Efforts have been made in the past in attempts to reduce such punch through leakage currents in FinFET devices. However, as device dimensions continue to shrink, better and more efficient techniques are desired in an effort to eliminate or reduce detrimental leakage currents.

The present disclosure is directed to various methods of forming isolated germanium-containing fins for a FinFET semiconductor device that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming isolated germanium-containing fins for a FinFET semiconductor device. One illustrative method disclosed herein includes, among other things, forming a layer of germanium-containing material on a surface of a semiconductor substrate, performing at least one first etching process to form a plurality of initial trenches that extend through the layer of germanium-containing material and into the substrate to an initial depth so as to thereby define an initial fin structure comprised of a portion of the layer of germanium-containing material and a first portion of the substrate, forming sidewall spacers adjacent the initial fin structure, after forming the sidewall spacers, performing a second etching process to extend the initial depth of the initial trenches into the substrate and thereby form a plurality of final trenches having a final depth that is greater than the initial depth and to define a second portion of the substrate positioned under the first portion of the substrate, forming a layer of insulating material so as to over-fill the final trenches and, with the layer of insulating material over-filling the final trenches, performing a thermal anneal process to convert at least a portion of the first or second portions of the substrate into a silicon dioxide isolation material that extends laterally under an entire width of the portion of the layer of germanium-containing material.

Another illustrative method disclosed herein involves, among other things, forming a trench in a semiconductor substrate, forming a layer of germanium-containing material in the trench in the substrate, performing at least one first etching process to form a plurality of initial trenches that extend through the layer of germanium-containing material and into the substrate to an initial depth so as to thereby define an initial fin structure comprised of a portion of the layer of germanium-containing material and a first portion of the substrate, forming sidewall spacers adjacent the initial fin structure, after forming the sidewall spacers, performing a second etching process to extend the initial depth of the initial trenches into the substrate and thereby form a plurality of final trenches having a final depth that is greater than the initial depth and to define a second portion of the substrate positioned under the first portion of the substrate, forming a layer of insulating material so as to over-fill the final trenches and, with the layer of insulating material over-filling the final trenches, performing a thermal anneal process to convert at least a portion of the first or second portions of the substrate into a silicon dioxide isolation material that extends laterally under an entire width of the portion of the layer of germanium-containing material.

Yet another illustrative method disclosed herein for forming CMOS devices includes, among other things, forming a trench in a semiconductor substrate, forming a layer of germanium-containing material in the trench in the substrate, performing at least one first etching process to form a plurality of first initial trenches and a plurality of second initial trenches, wherein the first initial trenches extend through the layer of germanium-containing material and into the substrate so as to thereby define a first initial fin structure comprised of a portion of the layer of germanium-containing material and a first portion of the substrate, and the second initial trenches are formed in the substrate in a region positioned outside of the trench in the substrate and thereby define a second initial fin structure consisting of the substrate material. In this embodiment, the method further comprises forming sidewall spacers adjacent the first and second initial fin structures, after forming the sidewall spacers, performing a second etching process to extend a depth of the first and second initial trenches into the substrate so as to thereby form a plurality of final trenches that define a second portion of the substrate positioned under the first portion of the substrate of the first initial fin structure and further extends a length of the second initial fin structure and thereby defines an extended fin structure consisting of the substrate material, forming a layer of insulating material so as to over-fill the final trenches and, with the layer of insulating material over-filling the final trenches, performing a thermal anneal process to convert at least a portion of the first or second portions of the substrate into a first silicon dioxide isolation material region that extends laterally under an entire width of the portion of the layer of germanium-containing material and to convert at least a portion of the material of the extended fin structure into a second silicon dioxide isolation material region that extends laterally under an entire width of a remaining portion of the extended fin structure.

BRIEF DESCRIPTION OF THE DRAWINGS

The disclosure may be understood by reference to the following description taken in conjunction with the accompanying drawings, in which like reference numerals identify like elements, and in which.

Figure 1:
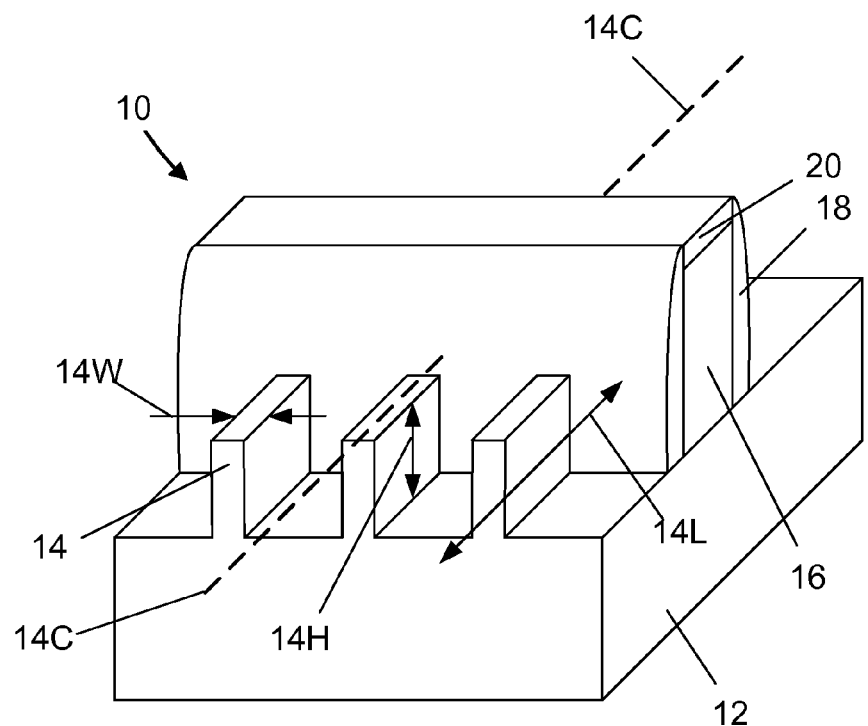
FIG. 1 depicts an illustrative example of a FinFET device with various features identified for reference purposes.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming isolated germanium-containing fins for a FinFET semiconductor device. The method disclosed herein may be employed in manufacturing either an N-type device or a P-type device, and the gate structure of such devices may be formed using either so-called "gate-first" or "replacement gate" ("gate-last") techniques. As will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. With reference to the attached figures, various illustrative embodiments of the methods and devices disclosed herein will now be described in more detail.

Figure 2A:
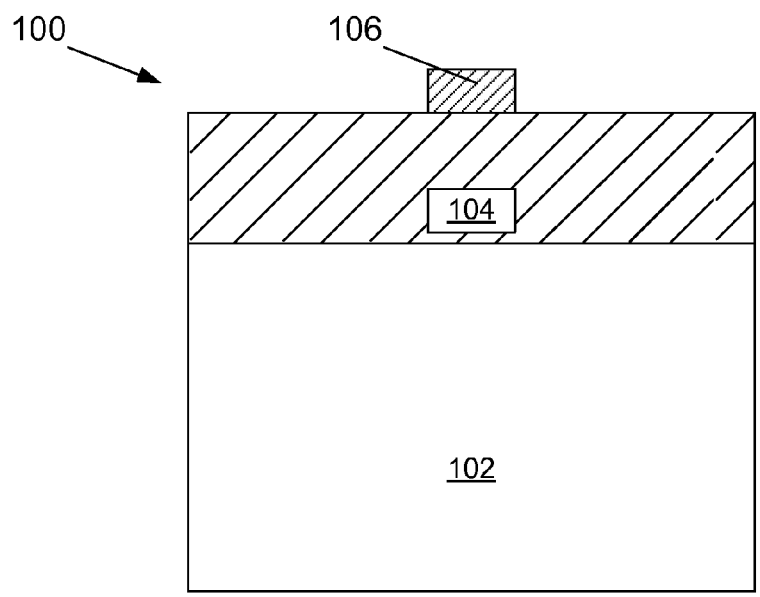
FIG. 2A-2H depict one illustrative method disclosed herein for forming isolated germanium-containing fins for a FinFET semiconductor device.

FIG. 2A is a perspective view of an illustrative FinFET semiconductor device 100 that may be formed in accordance with the methods disclosed herein. The device 100 is formed in and above a semiconductor substrate 102. The illustrative substrate 102 may be a bulk semiconductor substrate, or it may be the active layer of a so-called SOI (silicon-on-insulator) substrate or a so-called SGOI (silicon/germanium on insulator) substrate. Thus, the terms "substrate," "semiconductor substrate" or "semiconducting substrate" should be understood to cover all semiconductor materials and all forms of such semiconductor materials. The device 100 may be either a P-type FinFET device or an N-type FinFET device. The device 100 depicted in FIGS. 2A-2H will be depicted as only having a single fin. Of course, using the methods disclosed herein, a FinFET device may be formed with any desired number of fins. The various components and structures of the device disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application.

FIG. 2A depicts the device 100 at a point in fabrication wherein a layer of germanium-containing material 104 has been formed on the surface of the substrate 102. In one illustrative example, the layer of germanium-containing material 104 may be a layer of substantially pure germanium or a layer of silicon-germanium ($Si_xGe_{1-x}$). The layer of germanium-containing material 104 may be formed by performing known epitaxial deposition processes, and it may be formed to any desired thickness, e.g., 40-50 nm. In one aspect, the layer of germanium-containing material 104 may be formed to a thickness that is about 25% less than its critical thickness. The layer of germanium-containing material 104 may also be formed in a strained or unstrained condition. However, it is believed that, in many cases, better results will be obtained if the layer of germanium-containing material 104 is a strained layer of material. Also depicted in FIG. 2A is a portion of an illustrative patterned masking layer 106, e.g., a patterned hard mask layer (comprised of one or more deposited layers of material), a patterned photoresist mask, etc. Typically, the patterned masking layer 106 is a patterned layer of silicon nitride that may be formed by performing traditional deposition, photolithography and etching processes.

Figure 2B:
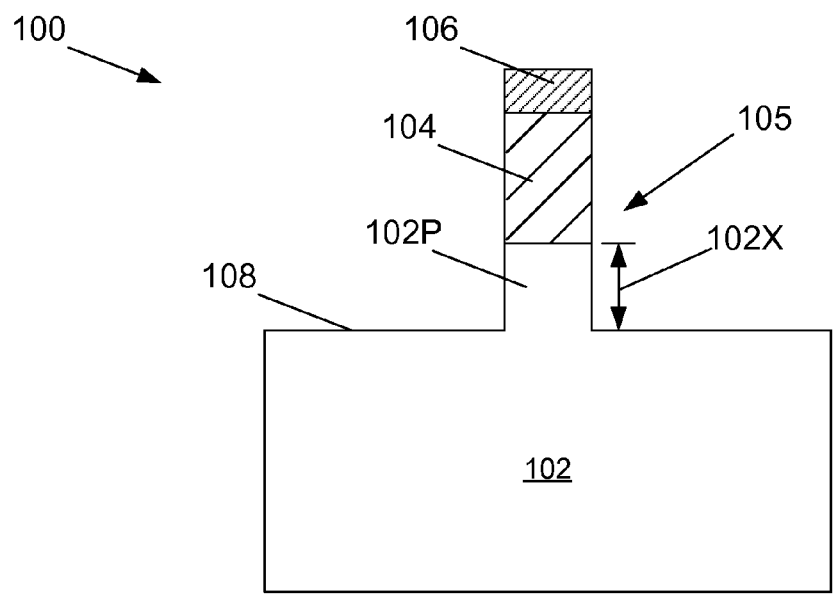

FIG. 2B depicts the device 100 after one or more first etching processes, e.g., anisotropic etching processes, were performed on the layer of germanium-containing material 104 and the substrate 102 through the patterned mask layer 106 to define a plurality of initial trenches 108 in the substrate 102. The formation of the trenches 108 results in the formation of an initial fin structure 105 comprised of a portion of the layer of germanium-containing material 104 and a first portion 102P of the substrate 102. The width and height of the fin structure 105 as well as the depth of the trenches 108 may vary depending upon the particular application. In one illustrative example, the height 102X of the portion 102P of the substrate 102 may be about 20-60 nm.

Figure 2C:
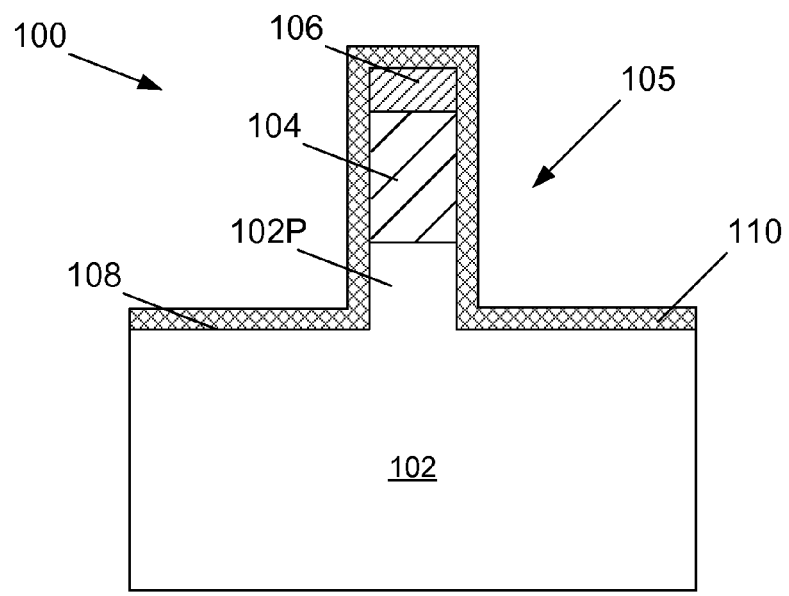

FIG. 2C depicts the device 100 after a sacrificial liner layer 110 has been deposited on the device 100. In one embodiment, the sacrificial liner layer 110 may be a layer of silicon nitride having a thickness of about 15-20 nm that is deposited by performing a conformal ALD or CVD process. As will be appreciated by those skilled in the art after a complete reading of the present application, the liner layer 110 is formed to protect the germanium-containing material portions 104 of the initial fin structure 105 during subsequent processing operations, as will be described more fully below.

Figure 2D:
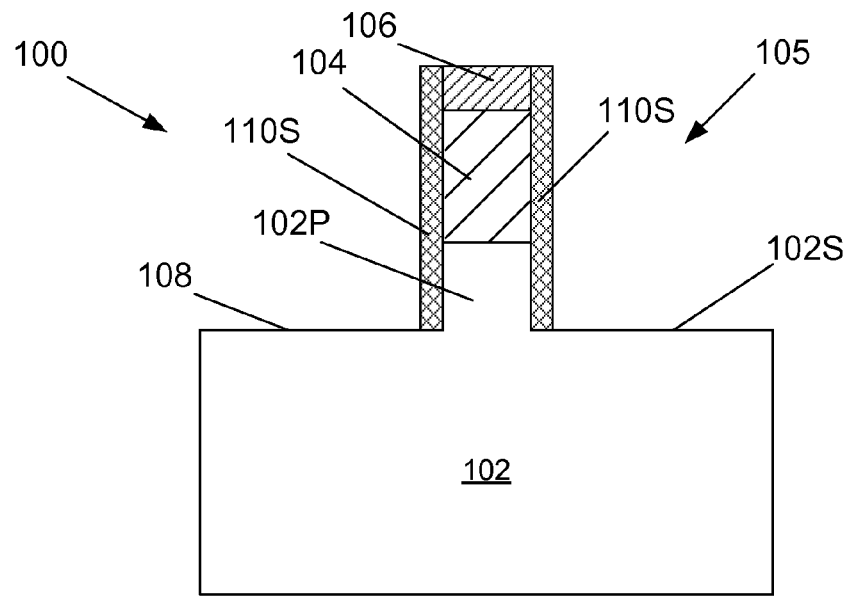

FIG. 2D depicts the device 100 after an anisotropic etching process was performed on the liner layer 110 to remove the horizontally-positioned portions of the liner layer 110. This etching process essentially forms protective sidewall spacers 110S adjacent the initial fin structure 105 and re-exposes the surface 102S of the substrate in the trenches 108.

Figure 2E:
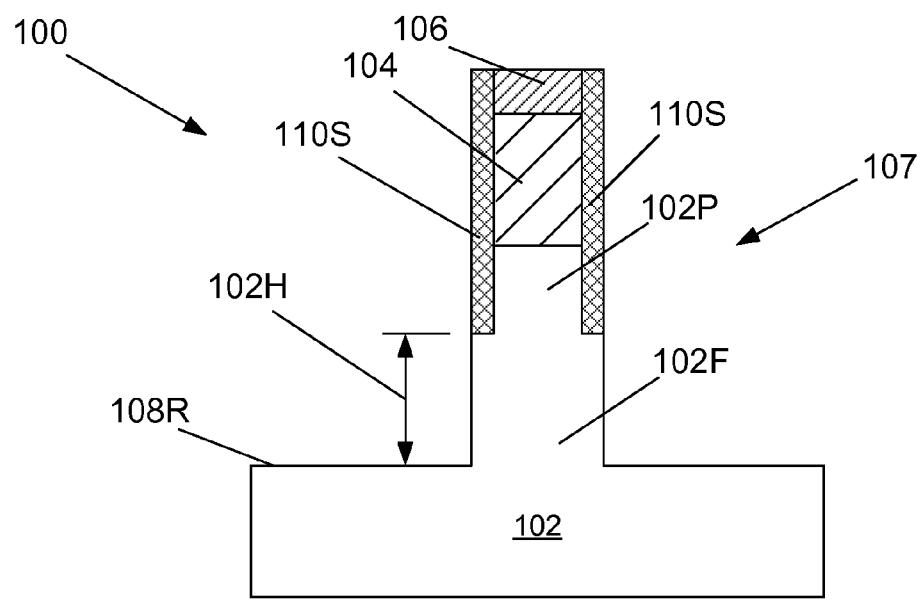

FIG. 2E depicts the device 100 after one or more second etching processes, e.g., anisotropic etching processes, were performed to extend the initial depth of the initial trenches 108 in the substrate 102. This second etching process results in a plurality of second trenches 108R that define a second fin structure 107 comprised of the portion of the layer of germanium-containing material 104, the first portion 102P of the substrate 102 and a further second portion 102F of the substrate 102. The width and height of the second fin structure 107 as well as the depth of the final trenches 108R may vary depending upon the particular application. In one illustrative example, the height 102H of the portion 102F is selected so as to correspond to the target thickness of the isolation material to be formed under the final fin structure for the device 100. In one illustrative embodiment, the height 102H may fall within the range of about 5-200 nm.

Figure 2F:
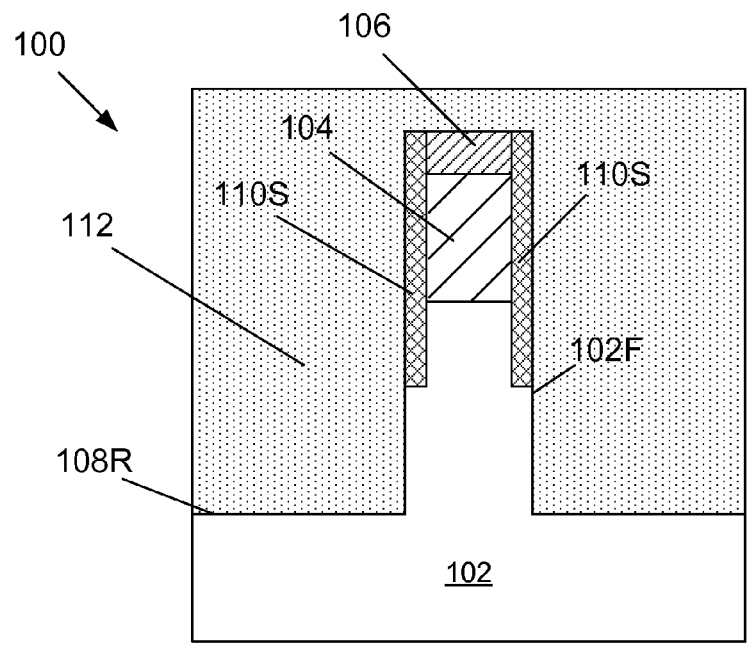

Thereafter, as shown in FIG. 2F, the final trenches 108R were overfilled with an insulating material 112. The layer of insulating material 112 discussed herein may be comprised of a variety of different materials, such as, for example, silicon dioxide, an oxygen-rich silicon dioxide, etc. or multiple layers thereof, etc., and it may be formed by performing a variety of techniques, e.g., chemical vapor deposition (CVD), etc. Although not depicted, if desired, a chemical mechanical polishing (CMP) process may be performed on the layer of insulating material 112 to planarize its upper surface with that of the patterned mask layer 106.

Figure 2G:
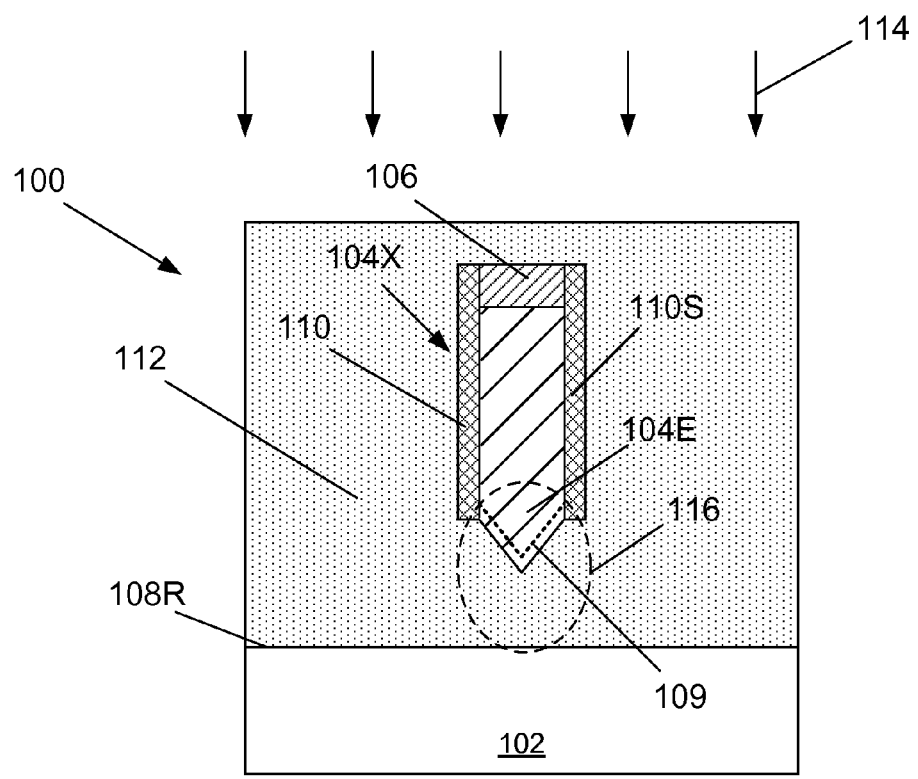

FIG. 2G depicts the device 100 after a thermal anneal process 114 was performed on the device 100. In general, the thermal anneal process 114 is performed under conditions such that substantially all of at least the second portion 102F of the second fin structure 107 is converted into an insulating material, e.g., silicon dioxide, as indicated within the dashed region 116. That is, the thermal anneal process 114 is performed under conditions such that isolation material is formed under the entire lateral width of the germanium-containing material portions of the remaining fin structure. Also note that, during this anneal process 114, the germanium in the germanium-containing material 104 (see FIG. 2F) of the second fin structure 107 migrated downward thereby converting all or a portion of at least the first portion 102P of the second fin structure 107 into a silicon-germanium material and/or into a silicon-germanium oxide material, as reflected by the extended portion or "bird's beak" 104E. Stated another way, the thermal anneal process 114 causes the height or length of the germanium-containing material portion 104 of the second fin structure 107 to be effectively increased. Accordingly, a new reference number—104X—is used to designate the germanium-containing material portion. The faceted end on the germanium-containing material 104X shown in FIG. 2G is due to the crystallographic orientation of the substrate 102. Also note that, as depicted in the dashed lines 109, at least some of the first portion 102P of the substrate material may also be present after the thermal anneal process 114 has been completed. The parameters of the thermal anneal process may vary depending upon the particular application. In one illustrative embodiment, the thermal anneal process 114 may be performed at a temperature that falls within the range of about 400-1200° C. for a duration in an oxidizing processing ambient (wet or dry). In some cases, the thermal anneal process 114 may be performed in an open-air furnace. The thermal anneal process 114 may be performed using an RTA furnace, a laser anneal process or a traditional furnace, depending upon the particular application. The duration of the thermal anneal process 114 may vary depending upon a variety of factors, e.g., it may range from nanoseconds to hours depending upon the particular processing tools and techniques used to perform the anneal process 114, such as an RTA chamber or a traditional furnace. Additionally, the rate of oxidation may be controlled or "tuned" by controlling the thickness of the layer of insulating material 112. It is anticipated that, in all cases, the layer of insulating material 112 will be deposited such that its upper surface is positioned above the upper surface of the masking layer 106 and that the thermal anneal process 114 will be performed with the final trenches 108 in such an overfilled condition. In general, the layer of insulating material 112 should be deposited such that its upper surface is positioned approximately level with to a few hundred nanometers above the upper surface of the masking layer 106, depending upon downstream planarization and the oxide recess scheme. However, to control the rate of oxidation, the layer of insulating material 112 may be deposited to an even greater thickness to reduce the rate of oxidation of the second portion 102F of the fin structure 107. Of course, as will be recognized by those skilled in the art after a complete reading of the present application, the thermal mixing process caused by the thermal anneal process 114 is essentially independent of the thickness of the layer of insulating material 112.

Figure 2H:
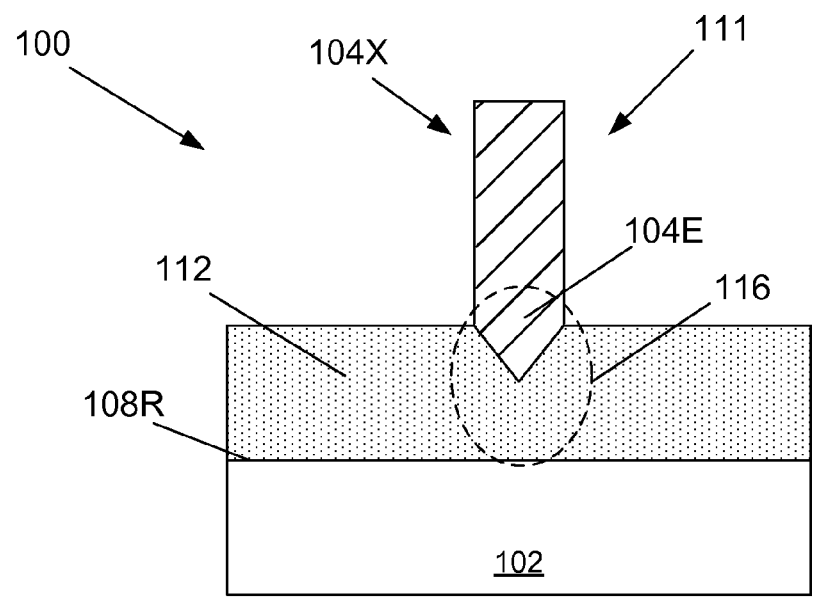

FIG. 2H depicts the device 100 after several process operations were performed.

First, an etching process was performed to recess the layer of insulating material 112 to a desired height such that the desired amount of the final fin structure 111 is exposed above the surface of the layer of insulating material 112. Thereafter, one or more etching processes were performed to remove the sidewall spacers 110S and the patterned mask layer 106. At this point in the process flow, the final fin structure 111 has been exposed to its final desired fin height and isolation material is positioned laterally under the entire width of the final fin structure 111, as indicated within the dashed line region 116. At this point, traditional manufacturing operations may be performed to complete the fabrication of the illustrative FinFET device 100, e.g., gate formation, etc.

Figure 3A:
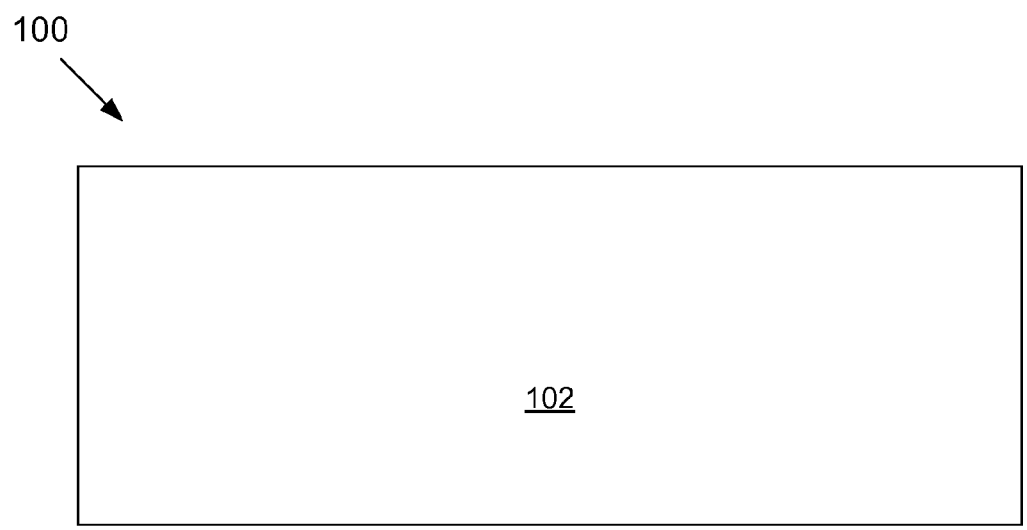
FIG. 3A-3K depict another illustrative method disclosed herein for forming isolated germanium-containing fins for a FinFET semiconductor device.

FIG. 3A-3K depict another illustrative method disclosed herein for forming isolated germanium-containing fins for one or more FinFET semiconductor devices. FIG. 3A depicts the initial substrate 102 that will be used to fabricate the FinFET devices as described herein.

Figure 3B:
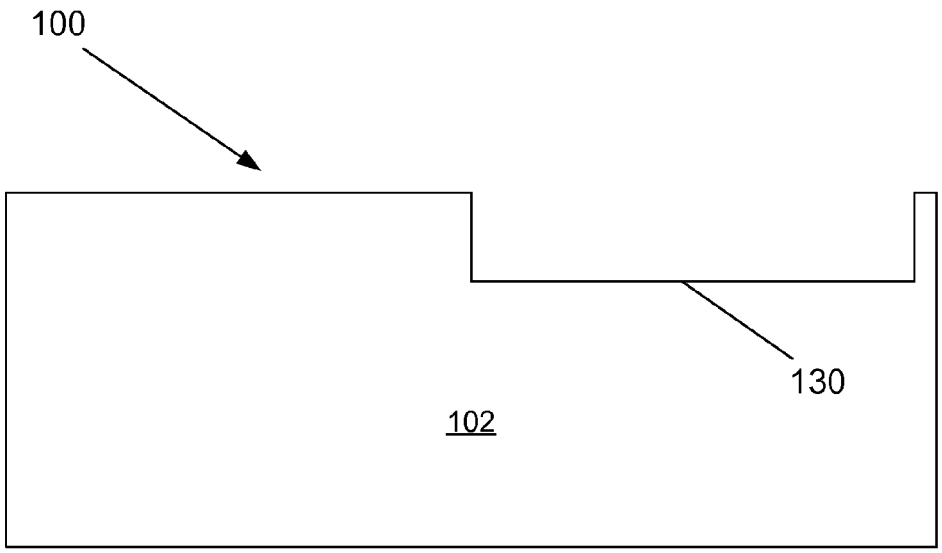

FIG. 3B depicts the device 100 after an etching process, e.g., an anisotropic etching process, was performed on the substrate 102 through a patterned mask layer (not shown) to define a substrate trench 130 in the substrate 102. The width and depth of the substrate trench 130 may vary depending upon the particular application. For example, the width of the substrate trench 130 may vary depending upon the number of fins to be formed from the material to be subsequently deposited in the substrate trench 130, as described more fully below.

Figure 3C:
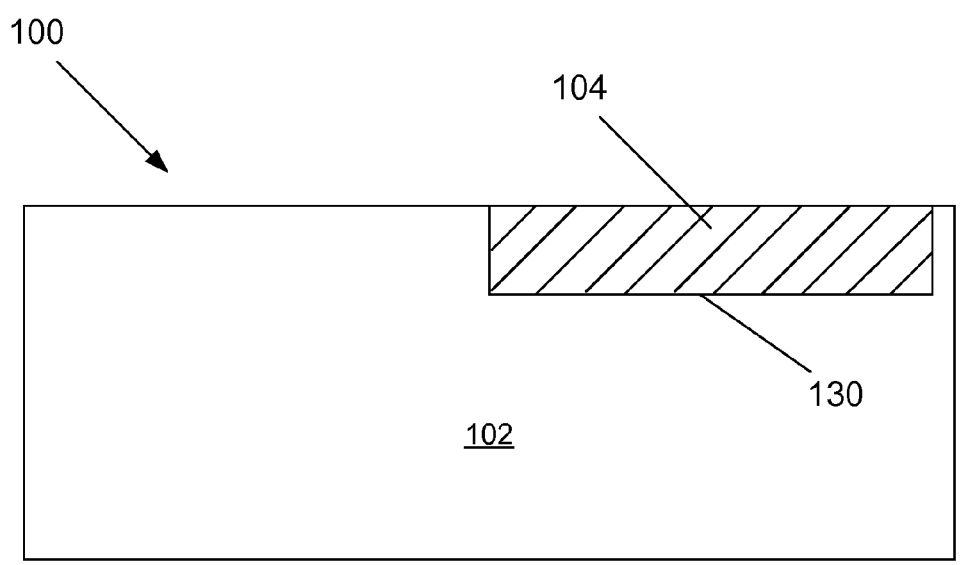

FIG. 3C depicts the device 100 at a point in fabrication after the patterned masking layer used to define the trench 130 has been removed and after a layer of the above-described germanium-containing material 104 has been formed in the substrate trench 130. A CMP process may have been performed at this point in the process flow to planarize the upper surface of the layer of germanium-containing material 104 with the upper surface of the substrate 102.

Figure 3D:
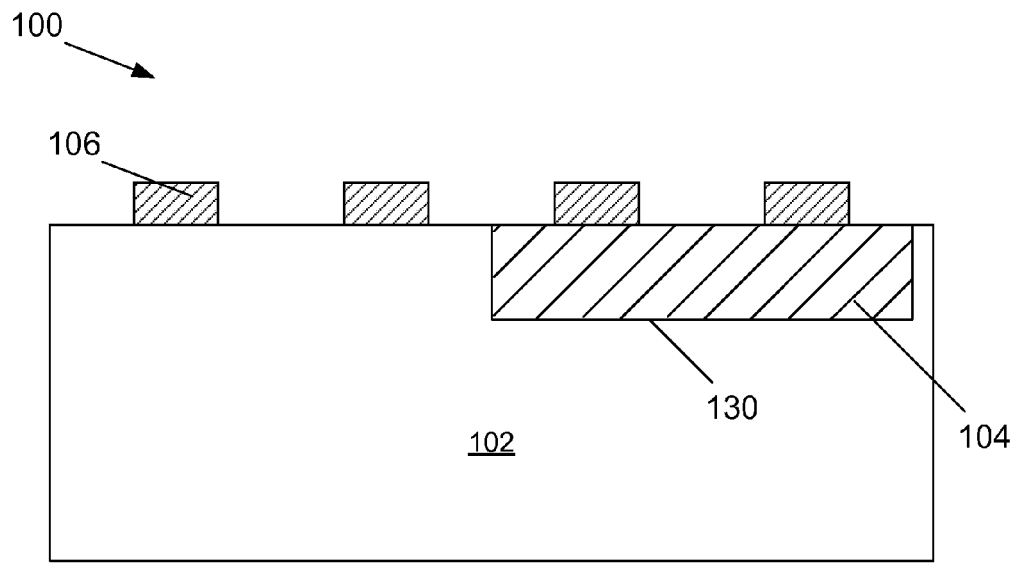

FIG. 3D depicts the device 100 after a portion of the above-described patterned masking layer 106, e.g., a patterned hard mask layer, has been formed above the device 100. In the particular example depicted herein, two illustrative fins will be formed using portions of the layer of germanium-containing material 104, while two other fins will be formed in the substrate 102 in regions positioned outside of the substrate trench 130. As noted previously, the patterned masking layer 106 is typically a patterned layer of silicon nitride that may be formed by performing traditional deposition, photolithography and etching processes.

Figure 3E:
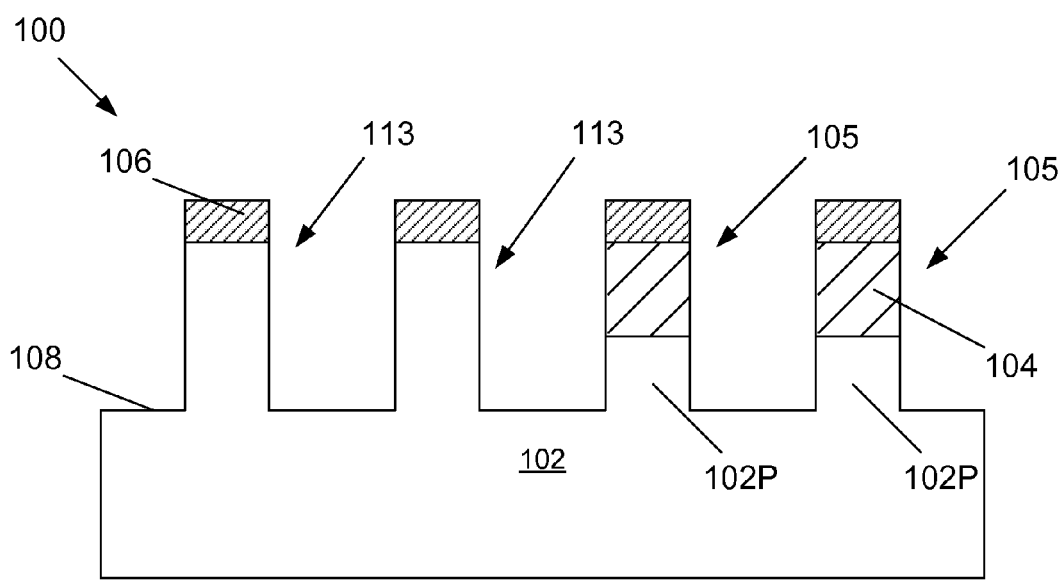

FIG. 3E depicts the device 100 after the above-described first etching processes, e.g., anisotropic etching processes, were performed on the substrate 102 and the layer of germanium-containing material 104 through the patterned mask layer 106 to define a plurality of initial trenches 108 in the substrate 102. The formation of the initial trenches 108 results in the formation of a plurality of the above-described initial fin structures 105 comprised of a portion of the layer of germanium-containing material 104 and a first portion 102P of the substrate 102. The formation of the initial trenches 108 also results in the formation of a plurality of fin structures 113 comprised of just the substrate material 102. As noted above, the width and height of the fin structures 105, 113 as well as the depth of the initial trenches 108 may vary depending upon the particular application.

Figure 3F:
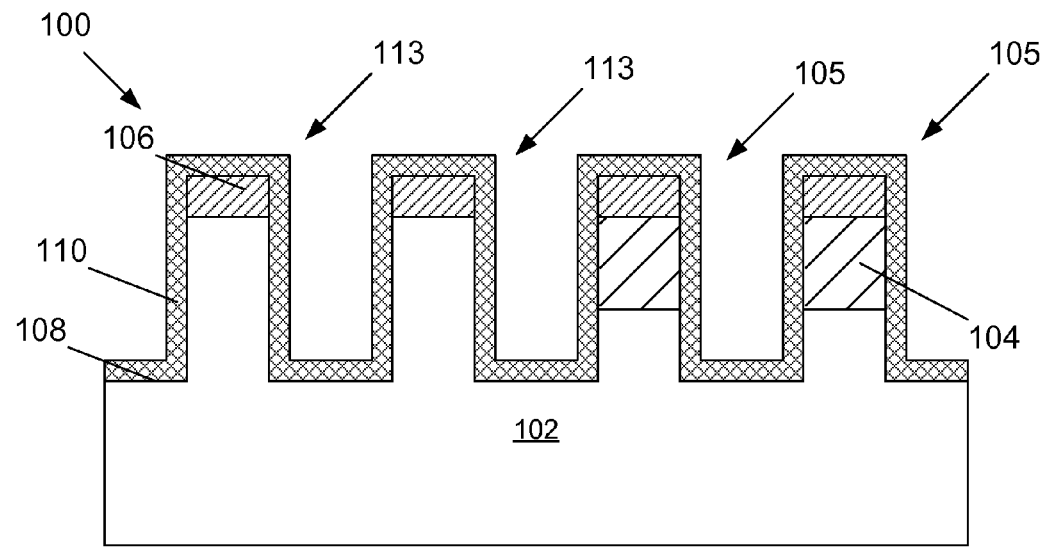

FIG. 3F depicts the device 100 after the above-described sacrificial liner layer 110 was deposited on the device 100.

Figure 3G:
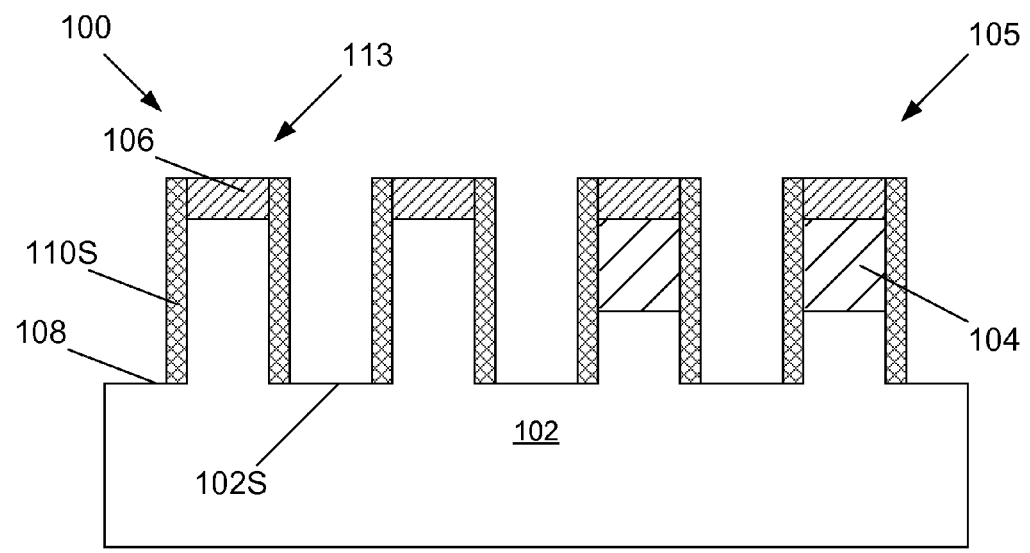

FIG. 3G depicts the device 100 after an anisotropic etching process was performed on the liner layer 110 to remove the horizontally-positioned portions of the liner layer 110. This etching process essentially forms protective sidewall spacers 110S adjacent the fin structures 105, 113 and re-exposes the surface 102S of the substrate 102 in the initial trenches 108.

Figure 3H:
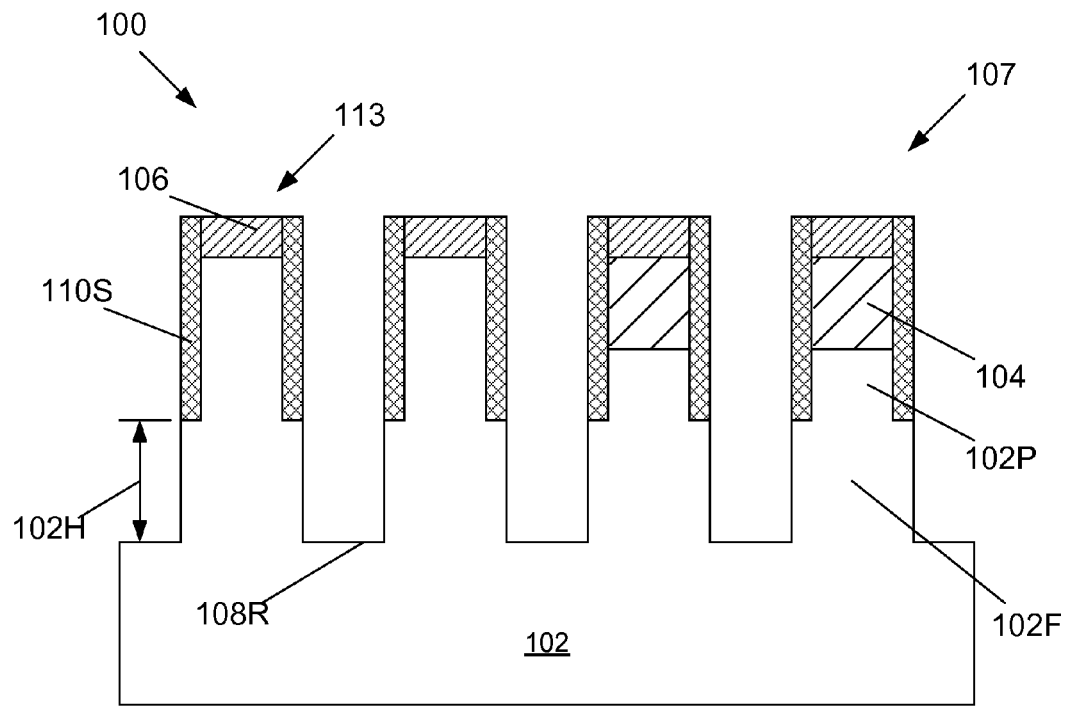

FIG. 3H depicts the device 100 after the above-described second etching process, e.g., an anisotropic etching process, was performed to extend the initial depth of the initial trenches 108 in the substrate 102. This second etching process results in the above-described second or final trenches 108R that define second fin structures 107 comprised of the portion of the layer of germanium-containing material 104, the first portion 102P of the substrate 102 and the second portion 102F of the substrate 102. This second etching process also extends the length of the fin structures 113. As mentioned above, the height 102H of the portion 102F is selected so as to correspond to the target thickness of the isolation material to be formed under the final fin structures for the device 100.

Figure 3I:
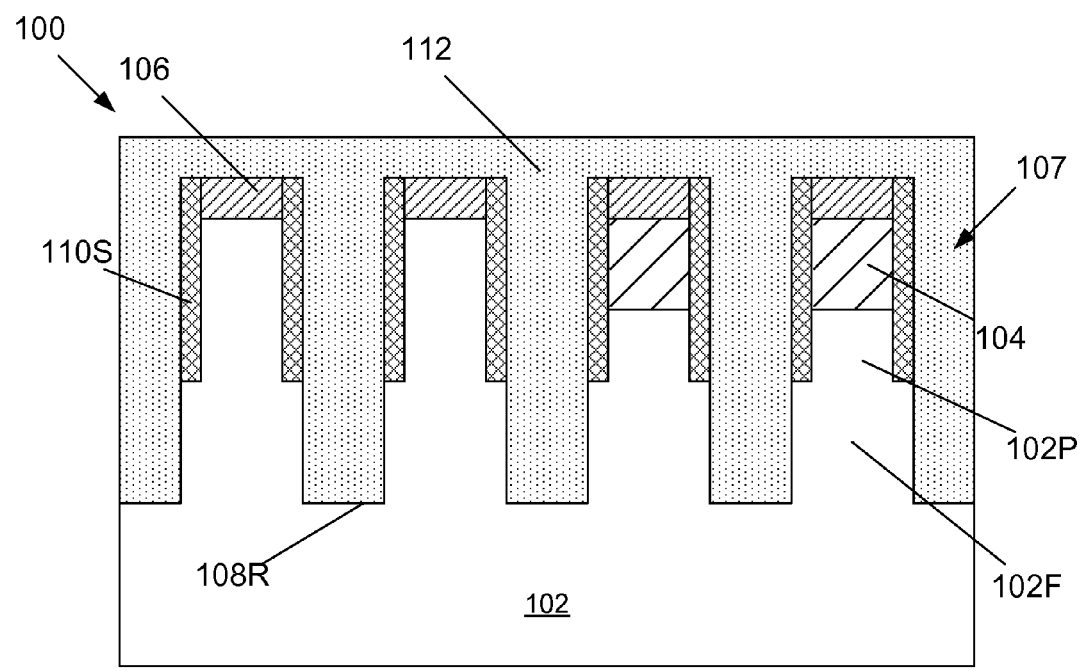

FIG. 3I depicts the device 100 after the final trenches 108R were overfilled with the above-described insulating material 112.

Figure 3J:
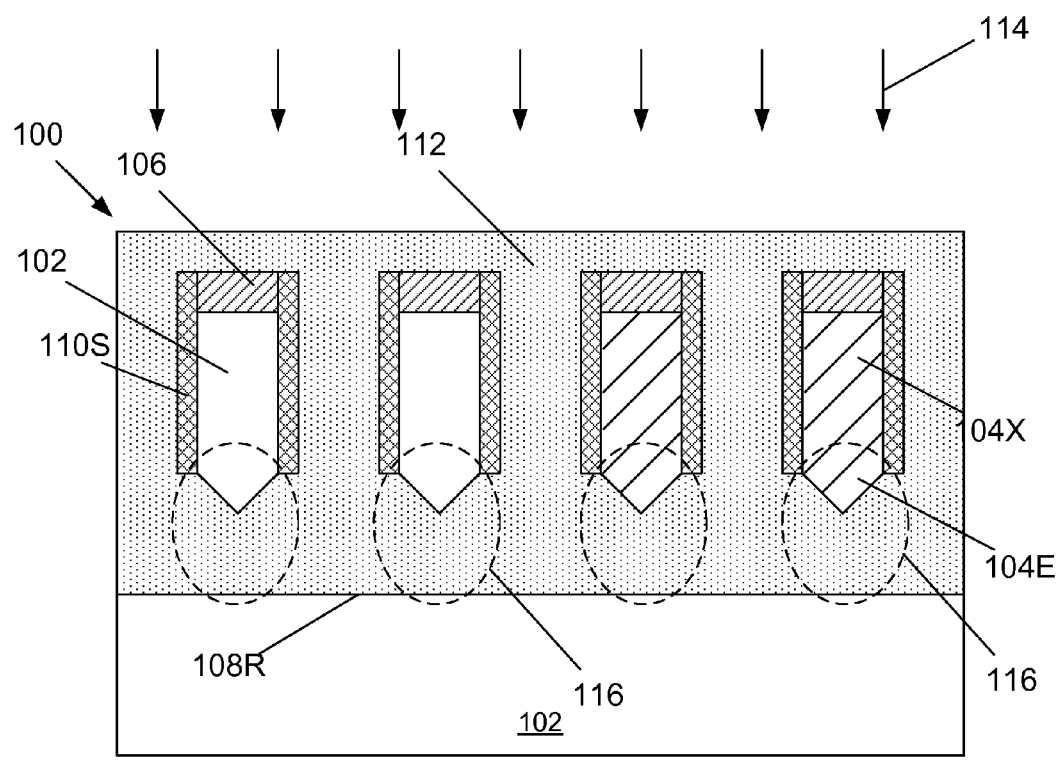

FIG. 3J depicts the device 100 after the above-described thermal anneal process 114 was performed on the device 100. As described above, the thermal anneal process 114 is performed under conditions such that substantially all of at least the second portion 102F (see FIG. 3I) of the second fin structure 107 is converted into an insulating material, e.g., silicon dioxide, as indicated within the dashed region 116. Also note that, during this anneal process 114, the germanium in the germanium-containing material 104 (see FIG. 3I) of the second fin structure 107 migrated downward thereby converting all or a portion of at least the first portion 102P of the second fin structure 107 into a silicon-germanium material and/or into a silicon-germanium oxide material, as reflected by the extended, bird's beak portion 104E. Stated another way, the thermal anneal process 114 causes the height or length of the germanium-containing material 104 of the second fin structure 107 to be effectively increased. Accordingly, a new reference number—104X—is used to designate the germanium-containing material portion.

Figure 3K:
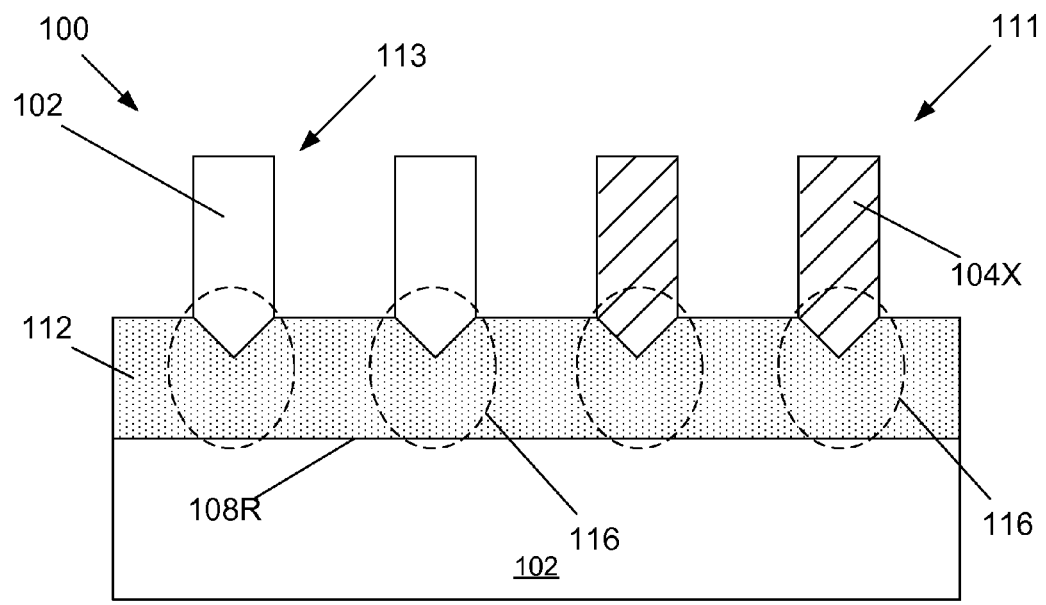

FIG. 3K depicts the device 100 after several process operations were performed. First, an etching process was performed to recess the layer of insulating material 112 to a desired height such that the desired amount of the final fin structures 111, 113 are exposed above the surface of the layer of insulating material 112. Thereafter, one or more etching processes were performed to remove the sidewall spacers 110S and the patterned mask layer 106. At this point in the process flow, the final fin structures 111, 113 have been exposed to their final desired fin height and isolation material is positioned laterally under the entire width of the final fin structures 111, 113 as indicated within the dashed line regions 116. At this point, traditional manufacturing operations may be performed to complete the fabrication of the illustrative FinFET device 100, e.g., gate formation, etc.

As will be appreciated by those skilled in the art after a complete reading of the present application, the embodiment shown in FIGS. 3A-3K may have special application in the context of manufacturing products using CMOS technology. For example, with reference to FIG. 3K, the final fin structures 113 may be for an NMOS device while the final fin structures 111 may be for a PMOS device. Thus, one illustrative method disclosed herein for forming CMOS devices includes, among other things, forming a trench 130 in a semiconductor substrate 102, forming a layer of germanium-containing material 104 in the trench 130, performing at least one first etching process to form a plurality of initial trenches 108, wherein a first group of the initial trenches 108 extend through the layer of germanium-containing material 104 and into the substrate 102 so as to thereby define a first initial fin structure 105 comprised of a portion of the layer of germanium-containing material 104 and a first portion 102P of the substrate 102, and a second group of the initial trenches 108 are formed in the substrate 102 in a region positioned outside of the trench 130 and thereby define a second initial fin structure 113 consisting of the substrate material 102. The method further comprises forming sidewall spacers 110S adjacent the first and second initial fin structures 105, 113, after forming the sidewall spacers 110S, performing a second etching process to extend a depth of the initial trenches 108 into the substrate 102 so as to thereby form a plurality of final trenches 108R that define a second portion 102F of the substrate positioned under the first portion 102P of the substrate of the first initial fin structure 105 and further extends a length of the second initial fin structure 113 and thereby defines an extended fin structure consisting of the substrate material 102, forming a layer of insulating material 112 so as to over-fill the final trenches 108R and, with the layer of insulating material 112 over-filling the final trenches 108R, performing a thermal anneal process 114 to convert at least a portion of the first 102P or second 102F portions of the substrate 102 into a first silicon dioxide isolation material region 116 that extends laterally under an entire width of the portion of the layer of germanium-containing material 104 and to convert at least a portion of the material of the extended fin structure into a second silicon dioxide isolation material region 116 that extends laterally under an entire width of a remaining portion of the extended fin structure 113.

In the illustrative examples depicted in the attached figures, the trenches 108, 108R and the fins (at various stages of formation) are all of a uniform size and shape. However, such uniformity in the size and shape of the trenches 108, 108R and the fins may not be required to practice at least some aspects of the inventions disclosed herein. In the example disclosed herein, the trenches 108, 108R are depicted as having been formed by performing an anisotropic etching process that results in the trenches 108, 108R having a schematically depicted, generally rectangular configuration with substantially vertical sidewalls. In an actual real-world device, the sidewalls of the trenches 108 may be somewhat inwardly tapered, although that configuration is not depicted in the attached drawings. In some cases, the trenches 108, 108R may have a reentrant profile near the bottom of the trenches 108, 108R. To the extent the trenches 108, 108R are formed by performing a wet etching process, the trenches 108, 108R may tend to have a more rounded configuration or non-linear configuration as compared to the generally rectangular configuration of the trenches 108, 108R that are formed by performing an anisotropic etching process. Thus, the size and configuration of the trenches 108, 108R, and the manner in which they are made, should not be considered a limitation of the present invention. For ease of disclosure, only the substantially rectangular trenches 108, 108R and fins have been depicted herein. Of course, if desired, the fins may be manufactured to have tapered or more vertically oriented sidewalls or even substantially vertical sidewalls, as depicted in the attached drawings.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a FinFET device, comprising:
    forming a layer of germanium-containing material on a surface of a semiconductor substrate;
    performing at least one first etching process to form a plurality of initial trenches that extend through said layer of germanium-containing material and into said substrate to an initial depth so as to thereby define an initial fin structure comprised of a portion of said layer of germanium-containing material and a first portion of said substrate;
    forming sidewall spacers adjacent said initial fin structure;
    after forming said sidewall spacers, performing a second etching process to extend said initial depth of said initial trenches into said substrate and thereby form a plurality of final trenches having a final depth that is greater than said initial depth and to define a second portion of said substrate positioned under said first portion of said substrate;
    forming a layer of insulating material so as to over-fill said final trenches; and
    with said layer of insulating material over-filling said final trenches, performing a thermal anneal process to convert at least a portion of said first or second portions of said substrate into a silicon dioxide isolation material that extends laterally under an entire width of said portion of said layer of germanium-containing material.

2. The method of claim 1, wherein forming said layer of insulating material so as to over-fill said final trenches comprises forming a layer of silicon dioxide so as to over-fill said final trenches such that an upper surface of said layer of insulating material is positioned above an upper surface of said initial fin structure.

3. The method of claim 1, wherein performing said thermal anneal process comprises performing said thermal anneal process at a temperature that falls within the range of 400-1200° C.

4. The method of claim 3, wherein performing said thermal anneal process comprises performing said thermal anneal process in an oxidizing process ambient.

5. The method of claim 1, wherein said germanium-containing material is comprised of substantially pure germanium or silicon-germanium ($Si_xGe_{1-x}$).

6. The method of claim 1, wherein performing said thermal anneal process to convert at least a portion of said first or second portions of said substrate into said silicon dioxide isolation material comprises performing said thermal anneal process to convert all of said second portion of said substrate into said silicon dioxide isolation material.

7. The method of claim 6, wherein performing said thermal anneal process to convert at least a portion of said first or second portions of said substrate into said silicon dioxide isolation material comprises performing said thermal anneal process to convert said first portion of said substrate into said silicon dioxide isolation material and into a germanium oxide material.

8. The method of claim 1, wherein performing said thermal anneal process to convert at least a portion of said first or second portions of said substrate into said silicon dioxide isolation material comprises performing said thermal anneal process to convert only a portion of said second portion of said substrate into said silicon dioxide isolation material.

9. The method of claim 1, wherein performing said thermal anneal process comprises performing said thermal anneal process so as to convert at least a portion of said first portion of said substrate into a silicon-germanium material.

10. The method of claim 1, further comprising:
    performing an etching process to recess a surface of said layer of insulating material; and
    removing said sidewall spacers.

11. A method of forming a FinFET device, comprising:
    forming a trench in a semiconductor substrate;
    forming a layer of germanium-containing material in said trench in said substrate;
    performing at least one first etching process to form a plurality of initial trenches that extend through said layer of germanium-containing material and into said substrate to an initial depth so as to thereby define an initial fin structure comprised of a portion of said layer of germanium-containing material and a first portion of said substrate;
    forming sidewall spacers adjacent said initial fin structure;
    after forming said sidewall spacers, performing a second etching process to extend said initial depth of said initial trenches into said substrate and thereby form a plurality of final trenches having a final depth that is greater than said initial depth and to define a second portion of said substrate positioned under said first portion of said substrate;
    forming a layer of insulating material so as to over-fill said final trenches; and
    with said layer of insulating material over-filling said final trenches, performing a thermal anneal process to convert at least a portion of said first or second portions of said substrate into a silicon dioxide isolation material that extends laterally under an entire width of said portion of said layer of germanium-containing material.

12. The method of claim 11, wherein performing said thermal anneal process comprises performing said thermal anneal process at a temperature that falls within the range of 400-1200° C.

13. The method of claim 11, wherein performing said thermal anneal process to convert at least a portion of said first or second portions of said substrate into said silicon dioxide isolation material comprises performing said thermal anneal process to convert all of said second portion of said substrate into said silicon dioxide isolation material.

14. The method of claim 13, wherein performing said thermal anneal process to convert at least a portion of said first or second portions of said substrate into said silicon dioxide isolation material comprises performing said thermal anneal process to convert said first portion of said substrate into said silicon dioxide isolation material and into a germanium oxide material.

15. The method of claim 11, wherein performing said thermal anneal process to convert at least a portion of said first or second portions of said substrate into said silicon dioxide isolation material comprises performing said thermal anneal process to convert only a portion of said second portion of said substrate into said silicon dioxide isolation material.

16. A method of forming a FinFET device, comprising:
forming a trench in a semiconductor substrate;
forming a layer of germanium-containing material in said trench in said substrate;
performing at least one first etching process to form a plurality of first initial trenches and a plurality of second initial trenches:
  wherein said first initial trenches extend through said layer of germanium-containing material and into said substrate so as to thereby define a first initial fin structure comprised of a portion of said layer of germanium-containing material and a first portion of said substrate; and
  wherein said second initial trenches are formed in said substrate in a region positioned outside of said trench in said substrate and thereby define a second initial fin structure consisting of said substrate material;
forming sidewall spacers adjacent said first and second initial fin structures;
after forming said sidewall spacers, performing a second etching process to extend a depth of said first and second initial trenches into said substrate so as to thereby form a plurality of final trenches that:
  define a second portion of said substrate positioned under said first portion of said substrate of said first initial fin structure; and
  further extends a length of said second initial fin structure and thereby defines an extended fin structure consisting of said substrate material;
forming a layer of insulating material so as to over-fill said final trenches; and
with said layer of insulating material over-filling said final trenches, performing a thermal anneal process:
  to convert at least a portion of said first or second portions of said substrate into a first silicon dioxide isolation material region that extends laterally under an entire width of said portion of said layer of germanium-containing material; and
  to convert at least a portion of said material of said extended fin structure into a second silicon dioxide isolation material region that extends laterally under an entire width of a remaining portion of said extended fin structure.

17. The method of claim 16, wherein said germanium-containing material is comprised of substantially pure germanium or silicon-germanium ($Si_xGe_{1-x}$).

18. The method of claim 16, wherein performing said thermal anneal process comprises performing said thermal anneal process at a temperature that falls within the range of 400-1200° C.

19. The method of claim 16, wherein forming said layer of insulating material so as to over-fill said final trenches comprises forming a layer of silicon dioxide so as to over-fill said final trenches such that an upper surface of said layer of insulating material is positioned above an upper surface of said first and second initial fin structure.

20. The method of claim 16, wherein performing said thermal anneal process to convert at least a portion of said first or second portions of said substrate into said first silicon dioxide isolation material region comprises performing said thermal anneal process to convert all of said second portion of said substrate into said first silicon dioxide isolation material region.

* * * * *